United States Patent
Ha et al.

(10) Patent No.: US 7,642,837 B2
(45) Date of Patent: Jan. 5, 2010

(54) INTERNAL VOLTAGE GENERATION CIRCUIT FOR SEMICONDUCTOR DEVICE AND METHOD FOR GENERATING INTERNAL VOLTAGE THEREIN

(75) Inventors: Sung-Joo Ha, Kyoungki-do (KR); Yoon-Jae Shin, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/967,553

(22) Filed: Dec. 31, 2007

(65) Prior Publication Data

US 2008/0284496 A1 Nov. 20, 2008

(30) Foreign Application Priority Data

May 14, 2007 (KR) .................. 10-2007-0046354

(51) Int. Cl.
*G05F 1/10* (2006.01)
(52) U.S. Cl. ....................................... 327/536
(58) Field of Classification Search ................ 327/535, 327/536, 537
See application file for complete search history.

(56) References Cited

U.S. PATENT DOCUMENTS

| 5,337,284 | A | * | 8/1994 | Cordoba et al. ............. 365/227 |
| 5,920,226 | A | * | 7/1999 | Mimura ....................... 327/537 |
| 6,563,746 | B2 | | 5/2003 | Fujioka et al. |
| 6,867,641 | B2 | | 3/2005 | Kang et al. |
| 6,947,347 | B2 | | 9/2005 | Fujioka |
| 7,091,769 | B2 | * | 8/2006 | Kwon et al. ................. 327/535 |
| 7,282,986 | B2 | * | 10/2007 | Kang et al. ................. 327/536 |
| 7,282,987 | B2 | * | 10/2007 | Lee et al. .................... 327/536 |
| 7,292,090 | B2 | * | 11/2007 | Lee et al. .................... 327/536 |
| 2004/0001385 | A1 | | 1/2004 | Kang |
| 2006/0091937 | A1 | | 5/2006 | Do |

FOREIGN PATENT DOCUMENTS

| JP | 10-125097 | 5/1998 |
| JP | 2003-085977 | 3/2003 |
| KR | 10-0639208 | 10/2006 |

OTHER PUBLICATIONS

Foreign Office Action issued on Apr. 30, 2008 in the corresponding JP application 10-2007-0046354 with an English translation.

* cited by examiner

*Primary Examiner*—Jeffrey S Zweizig
(74) *Attorney, Agent, or Firm*—IP & T Law Firm PLC

(57) ABSTRACT

An internal voltage generation circuit of a semiconductor device includes: a voltage detecting unit configured to detect a voltage level of an internal voltage output terminal to output a voltage detection signal; an oscillating unit configured to generate a first oscillation signal having a predefined frequency in response to the voltage detection signal; and a pumping unit configured to perform a charge pumping operation in response to the first oscillation signal and the voltage detection signal to output an internal voltage to the internal voltage output terminal, a period of the charge pumping operation being limited within an activation period of the voltage detection signal.

5 Claims, 5 Drawing Sheets

INTERNAL VOLTAGE GENERATION CIRCUIT FOR SEMICONDUCTOR DEVICE AND METHOD FOR GENERATING INTERNAL VOLTAGE THEREIN

CROSS-REFERENCE TO RELATED APPLICATIONS

The present invention claims priority of Korean patent application number 10-2007-0046354, filed on May 14, 2007, which is incorporated by reference in its entirety.

BACKGROUND OF THE INVENTION

The present invention relates to semiconductor devices, and more particularly, to an internal voltage generation circuit for a semiconductor device which is capable of reducing unnecessary power consumption, and a method for generating an internal voltage therein.

Most semiconductor devices such as a dynamic random access memory (DRAM) devices include an internal voltage generation circuit inside a chip to supply voltages necessary for operation of internal circuits. The internal voltage generation circuit is a circuit for generating internal voltages of various levels by using an external power supply voltage (VDD) and a ground voltage (VSS). In designing the internal voltage generation circuit, a main issue is to stably supply an internal voltage having a desired level.

As semiconductor devices operate at higher speed, requirements for low power consumption are increasing and thus design techniques for meeting performance required at a low voltage environment are needed. In such a low power environment, most of semiconductor devices use a high voltage (VPP) having a voltage level higher than a power supply voltage (VDD) so as to compensate for a voltage loss generated when they operate at the power supply voltage (VDD) and to retain stable data.

Specifically, DRAM devices widely use a high voltage (VPP) for compensating for loss caused by a threshold voltage of a MOS transistor in a word line driver, a signal line separator, a data output buffer, and so on. In a DRAM, a back bias voltage (VBB) having a voltage level lower than the ground voltage (VSS) is applied to a bulk of an NMOS transistor used as a cell transistor. The high voltage (VPP) and the back bias voltage (VBB) are generated by a charge pumping operation. A high voltage (VPP) generator and a back bias voltage (VBB) generator have the same configuration because their voltage generation mechanisms are equal to each other.

FIG. 1 is a block diagram of a conventional internal voltage generation circuit of a semiconductor device. The conventional internal voltage generation circuit includes a voltage detecting unit 100, an oscillating unit 120, and a pumping unit 140. The voltage detecting unit 100 detects a voltage level of an internal voltage (VPP) output terminal to output a voltage detection signal DET. The oscillating unit 120 generates an oscillation signal OSC having a predefined frequency in response to the voltage detection signal DET. The pumping unit 140 performs a charge pumping operation in response to the oscillation signal OSC to output an internal voltage VPP to the internal voltage (VPP) output terminal.

The pumping unit 140 includes a pumping controller 142 and a charge pump 144. The pumping controller 142 generates a pumping control signal CTRL in response to the oscillation signal OSC. The charge pump 144 performs a charge pumping operation in response to the pumping control signal CTRL to output the internal voltage VPP to the internal voltage (VPP) output terminal.

Further, first to third drivers 160, 170 and 146 for driving output signals of the respective components are provided among the respective components of the internal voltage generation circuit; i.e., the voltage detecting unit 100, the oscillating unit 120, the pumping controller 142, and the charge pump 144. Each of the first to third drivers 160, 170 and 146 includes a plurality of inverters constructing inverter chains. An operation of the conventional internal voltage generation circuit will be described below.

The voltage detecting unit 100 generates the voltage detection signal DET by comparing a reference voltage VREF with the internal voltage VPP fed back from the internal voltage (VPP) output terminal of the pumping unit 140. The voltage detection signal DET is activated when the internal voltage VPP is lower than the reference voltage VREF, and it is deactivated when the internal voltage VPP is higher than the reference voltage VREF. An activation period of the voltage detection signal DET is changed according to the voltage level difference between the internal voltage VPP and the reference voltage VREF. The voltage detection signal DET has a long activation period when the voltage level difference between the internal voltage VPP and the reference voltage VREF is relatively great, and it has a short activation period when the voltage level difference between the internal voltage VPP and the reference voltage VREF is relatively small.

The first driver 160 is connected to a voltage detection signal (DET) output terminal. The first driver 160 maintains a phase and a logic level of the voltage detection signal DET as they are, and pulls up or pulls down the voltage level of the voltage detection signal DET, thereby preventing the voltage detection signal DET from being floated by noise.

The oscillating unit 120 generates the oscillation signal OSC having the predefined frequency in response to the voltage detection signal DET inputted from the voltage detecting unit 100. The oscillation signal OSC is oscillated at the predefined frequency when the voltage detection signal DET is activated. The oscillation signal OSC is maintained at a deactivated state, without being oscillated, when the voltage detection signal DET is deactivated. When the internal voltage VPP is lower than the reference voltage VREF, the oscillation signal OSC is oscillated at the predefined frequency. When the internal voltage VPP is higher than the reference voltage VREF, the oscillation signal OSC is maintained at a deactivated state, without being oscillated.

The second driver 170 is connected to an oscillation signal (OSC) output terminal. The second driver 170 maintains a phase and a logic level of the oscillation signal OSC as they are, and pulls up or pulls down the voltage level of the oscillation signal OSC, thereby preventing the oscillation signal OSC from being floated by noise.

When the oscillation signal OSC is oscillated at a predefined frequency, the pumping unit 140 performs a charge pumping operation to generate the internal voltage VPP. When the oscillation signal OSC is not oscillated and is in a deactivated state, the pumping unit 140 performs no charge pumping operation, so that the internal voltage VPP is not generated. When the internal voltage VPP is lower than the reference voltage VREF, the pumping unit 140 performs a charge pumping operation to generate the internal voltage VPP. When the internal voltage VPP is higher than the reference voltage VREF, the pumping unit 140 performs no charge pumping operation, so that the internal voltage VPP is not generated.

The pumping controller 142 of the pumping unit 140 generates the pumping control signal CTRL in response to the oscillation signal OSC. The pumping control signal CTRL is a signal for controlling the charge pumping operation of the charge pump 144. The pumping control signal CTRL is generated by changing the phase of the oscillation signal OSC. The pumping control signal CTRL may include multiple signals each having a different phase. The number and waveform of the pumping control signal CTRL may be changed according to the configuration of the charge pump 144 of the pumping unit 140.

Like the first and second drivers 160 and 170, the third driver 146 is connected to a pumping control signal (CTRL) output terminal. The third driver 146 maintains a phase and a logic level of the pumping control signal CTRL as they are, and pulls up or pulls down the voltage level of the pumping control signal CTRL, thereby preventing the pumping control signal CTRL from being floated by noise.

When a plurality of codes are included in the pumping control signal CTRL, the third driver 146 is provided in plurality. The third drivers 146 are connected to the plurality of codes of the pumping control signal CTRL in 1:1 correspondence.

The charge pump 144 performs a charge pumping operation in response to the pumping control signal CTRL to generate the internal voltage VPP. For example, when the pumping control signal CTRL is oscillated, the charge pump 144 performs a charge pumping operation to generate the internal voltage VPP. When the pumping control signal CTRL is not oscillated, the charge pump 144 performs no charge pumping operation, so that the internal voltage VPP is not generated.

In summary, when the internal voltage VPP is lower than the reference voltage VREF, the charge pumping operation is performed to increase the voltage level of the internal voltage VPP. On the other hand, when the voltage level of the internal voltage VPP is higher than the reference voltage VREF, the charge pumping operation is not performed until the voltage level of the internal voltage VPP becomes lower than a voltage level of the reference voltage VREF.

FIG. 2 is a timing diagram of the various signals in the conventional internal voltage generation circuit of FIG. 1. The voltage level of the internal voltage VPP repetitively rises and falls according to the voltage detection signal DET, and its variation width is relatively great.

More specifically, when the voltage detection signal DET is in a deactivated initial state of a logic high level, the oscillation signal OSC outputted from the oscillating unit 120 is not oscillated but maintained in a deactivated state of a logic low level. First to fourth codes, i.e., P1, P2, G1 and G2, included in the pumping control signals CTRL are also not oscillated but maintained in a deactivated state of a logic high or low level.

Therefore, the charge pump 144 does not perform a charge pumping operation, so that the voltage level of the internal voltage VPP falls. In the semiconductor device, the voltage level of the internal voltage VPP may fall due to a direct use or a natural discharge.

The voltage detection signal DET is activated when the voltage level of the internal voltage VPP becomes lower than a target level. When the voltage detection signal DET is activated to a logic low level, the oscillation signal OSC is oscillated at a predefined frequency and thus the first to fourth codes P1, P2, G1 and G2 are also oscillated at a predefined frequency.

The charge pump 144 performs a charge pumping operation to increase the voltage level of the increase voltage VPP. Thereafter, the voltage detection signal DET is deactivated when the voltage level of the internal voltage VPP sufficiently increases and becomes higher than the target level.

When the voltage detection signal DET is deactivated to a logic high level, the oscillation signal OSC is deactivated to a logic low level without being oscillated. Thus, the first to fourth codes P1, P2, G1 and G2 are deactivated to a logic high or low level without being oscillated.

In the conventional internal voltage generation circuit, the voltage detection signal DET is deactivated when the voltage level of the internal voltage VPP is higher than the voltage level of the reference voltage VREF and must pass through the oscillating unit 120 and the pumping controller 142, so that it can be transferred up to the charge pump 144 performing the actual charge pumping operation.

In this way, the voltage detecting unit 100 deactivates the activated voltage detection signal DET immediately when the voltage level of the internal voltage VPP reaches the target level. However, the charge pump 144 is controlled by the deactivated voltage detection signal DET passing through the oscillating unit 120 and the pumping controller 142. Therefore, the charge pump 144 continuously operates during a time period ① where the voltage detection signal DET passes through the oscillating unit 120 and the pumping controller 142, thereby increasing the voltage level of the internal voltage VPP.

If the charge pump 144 continuously operates during the time period ① where the voltage detection signal DET passes through the oscillating unit 120 and the pumping controller 142 even when the voltage level of the internal voltage VPP need not be increased, the voltage level of the internal voltage VPP excessively increases, causing malfunction of the semiconductor device.

Further, the oscillating unit 120, the pumping controller 142, and the charge pump 144 unnecessarily operate during the time period ① where the voltage detection signal DET passes through the oscillating unit 120 and the pumping controller 142 even when the voltage level of the internal voltage VPP need not be increased. Consequently, the semiconductor device unnecessarily consumes power due to the unnecessary operation.

SUMMARY OF THE INVENTION

Embodiments of the present invention are directed to providing an internal voltage generation circuit that can prevent malfunction and unnecessary power consumption of a semiconductor device, which may be caused by delay of a signal for controlling a charge pumping operation.

In accordance with a first aspect of the present invention, there is provided an internal voltage generation circuit of a semiconductor device, including: a voltage detecting unit configured to detect a voltage level of an internal voltage output terminal to output a voltage detection signal; an oscillating unit configured to generate a first oscillation signal having a predefined frequency in response to the voltage detection signal; and a pumping unit configured to perform a charge pumping operation in response to the first oscillation signal and the voltage detection signal to output an internal voltage to the internal voltage output terminal, a period of the charge pumping operation being limited within an activation period of the voltage detection signal.

In accordance with a second aspect of the present invention, there is provided a method for generating an internal voltage in a semiconductor device, including: detecting a voltage level of an internal voltage to output a voltage detection signal; generating a first oscillation signal having a predefined frequency in response to the voltage detection signal;

performing a charge pumping operation in response to the first oscillation signal and the voltage detection signal to output an internal voltage to an internal voltage output terminal, a period of the charge pumping operation being limited within an activation period of the voltage detection signal.

In accordance with a third aspect of the present invention, there is provided a semiconductor device, including: a voltage detecting unit configured to detect a voltage level of an internal voltage output terminal to output a voltage detection signal; an oscillating unit configured to generate a first oscillation signal having a predefined frequency in response to the voltage detection signal; and a plurality of pumping units, each pumping unit configured to perform a charge pumping operation in response to the first oscillation signal and the voltage detection signal to output an internal voltage to the internal voltage output terminal, a period of the charge pumping operation being limited within an activation period of the voltage detection signal.

DESCRIPTION OF SPECIFIC EMBODIMENTS

Hereinafter, an internal voltage generation circuit of a semiconductor device and a method for generating an internal voltage therein in accordance with the present invention will be described in detail with reference to the accompanying drawings.

Figure 1:
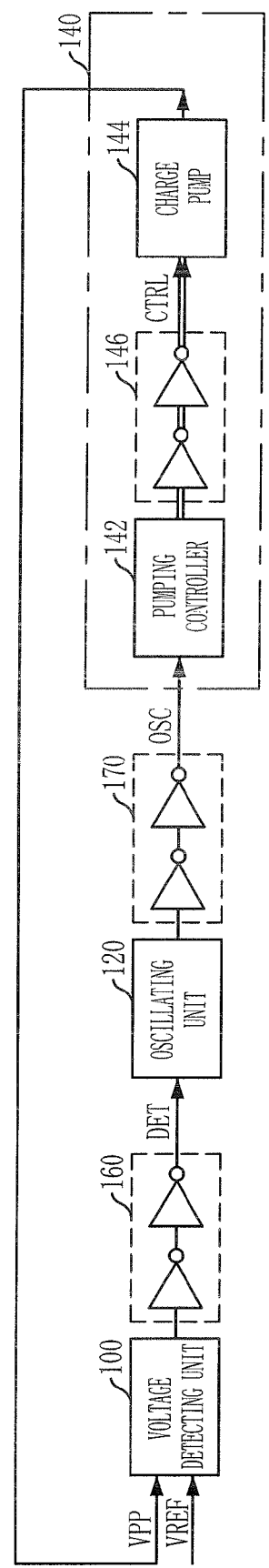
FIG. 1 is a block diagram of a conventional internal voltage generation circuit of a semiconductor device.
Figure 2:
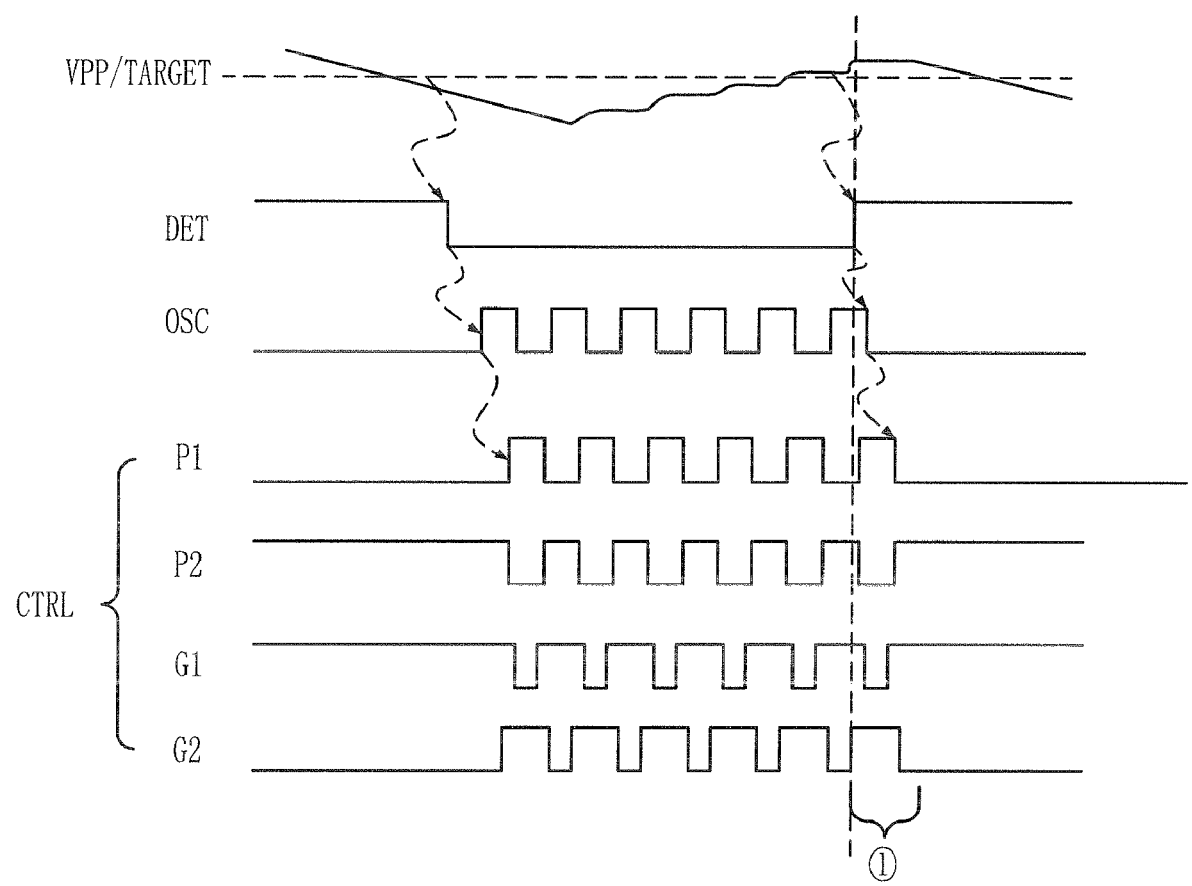
FIG. 2 is a timing diagram of signals in the conventional internal voltage generation circuit of FIG. 1.
Figure 3:
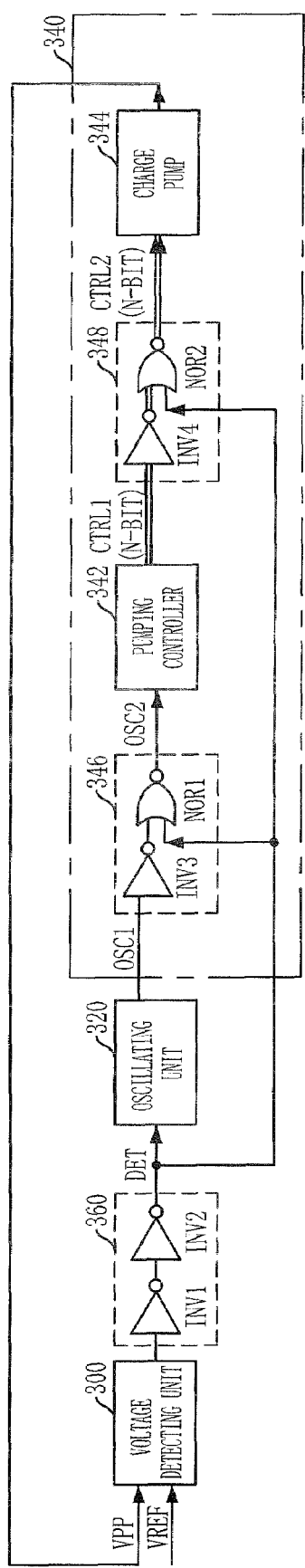
FIG. 3 is a block diagram of an internal voltage generation circuit of a semiconductor device in accordance with a first embodiment of the present invention.

FIG. 3 is a block diagram of an internal voltage generation circuit of a semiconductor device in accordance with a first embodiment of the present invention. In this embodiment, the internal voltage generation circuit includes a voltage detecting unit 300, an oscillating unit 320, and a pumping unit 340. The voltage detecting unit 300 detects a voltage level of an internal voltage (VPP) output terminal to output a voltage detection signal DET. The oscillating unit 320 generates a first oscillation signal OSC1 having a predefined frequency in response to the voltage detection signal DET. The pumping unit 340 performs a charge pumping operation in response to the first oscillation signal OSC1 to output the internal voltage VPP to the internal voltage (VPP) output terminal. At this point, a period of the charge pumping operation is limited within an activation period of the voltage detection signal DET.

The pumping unit 340 includes a first driver 346, a pumping controller 342, a second driver 348, and a charge pump 344. The first driver 346 drives a second oscillation signal OSC2 having a frequency equal to that of the first oscillation signal OSC1 in response to the first oscillation signal OSC1. An oscillation period of the second oscillation signal OSC2 is limited to an activation period of the voltage detection signal DET. The pumping controller 342 generates a first pumping control signal CTRL1 in response to the second oscillation signal OSC2. The second driver 348 drives a second pumping control signal CTRL2 having a frequency equal to that of the first pumping control signal CTRL1 in response to the first pumping control signal CTRL1. An oscillation period of the second pumping control signal CTRL2 is limited to an activation period of the voltage detection signal DET. The charge pump 344 performs a charge pumping operation in response to the second pumping control signal CTRL2 to output the internal voltage VPP to the internal voltage (VPP) output terminal.

The first driver 346 of the pumping unit 340 includes a first inverter INV3 configured to invert the first oscillation signal OSC1, and a first NOR gate NOR1 configured to perform a NOR operation on an output signal of the first inverter INV3 and the voltage detection signal DET to output the second oscillation signal OSC2.

The second driver 348 of the pumping unit 340 includes a second inverter INV4 configured to invert the first pumping control signal CTRL1, and a second NOR gate NOR2 configured to perform a NOR operation on an output signal of the second inverter INV4 and the voltage detection signal DET to output the second pumping control signal CTRL2.

A third driving unit 360 is further provided between the voltage detecting unit 300 and the oscillating unit 320 and drives the voltage detection signal DET. The third driving unit 360 maintains a phase and a logic level of the voltage detection signal DET as they are, and pulls up or pulls down the voltage level of the voltage detection signal DET, thereby preventing the voltage detection signal DET from being floated by noise. The third driving unit 360 may include an inverter chain implemented with a plurality of inverters INV1 and INV2.

An operation of the internal voltage generation circuit will be described below.

The voltage detecting unit 300 determines a voltage level of the voltage detection signal DET by comparing a voltage level of a reference voltage VREF with a voltage level of the internal voltage VPP fed back from the internal voltage (VPP) output terminal of the pumping unit 340.

For example, the voltage detection signal DET is activated when the internal voltage VPP is lower than the reference voltage VREF, and it is deactivated when the internal voltage VPP is higher than the reference voltage VREF.

An activation period of the voltage detection signal DET is changed according to a voltage level difference between the internal voltage VPP and the reference voltage VREF. The voltage detection signal DET has a long activation period when the voltage level difference between the internal voltage VPP and the reference voltage VREF is relatively great, and it has a short activation period when the voltage level difference between the internal voltage VPP and the reference voltage VREF is relatively small. Further, the voltage level of the reference voltage VREF is equal to a target level of the internal voltage VPP.

The third driving unit 360 is connected to a voltage detection signal (DET) output terminal. The third driver 360 maintains a phase and a logic level of the voltage detection signal DET as they are, and pulls up or pulls down the voltage level of the voltage detection signal DET, thereby preventing the voltage detection signal DET from being floated by noise.

The oscillating unit 320 generates the first oscillation signal OSC1 having a predefined frequency in response to the voltage detection signal DET inputted from the voltage detecting unit 300.

For example, the first oscillation signal OSC1 is oscillated at the predefined frequency when the voltage detection signal DET is activated. The first oscillation signal OSC1 is maintained at a deactivated state, without being oscillated, when the voltage detection signal DET is deactivated. Thus, when the internal voltage VPP is lower than the reference voltage VREF, the first oscillation signal OSC1 is oscillated at a predefined frequency. When the internal voltage VPP is higher than the reference voltage VREF, the first oscillation signal OSC1 is maintained at a deactivated state, without being oscillated.

When the first oscillation signal OSC1 is oscillated at the predefined frequency, the pumping unit 340 performs a charge pumping operation to generate the internal voltage VPP. When the first oscillation signal OSC1 is not oscillated and is in a deactivated state, the pumping unit 340 performs no charge pumping operation, so that the internal voltage VPP is not generated.

When the internal voltage VPP is lower than the reference voltage VREF, the pumping unit 340 performs a charge pumping operation to generate the internal voltage VPP. On the other hand, when the internal voltage VPP is higher than the reference voltage VREF, the pumping unit 340 terminates the charge pumping operation in response to the deactivation of the voltage detection signal DET, regardless of the oscillation of the first oscillation signal OSC1.

The first driver 346 of the pumping unit 340 receives the first oscillation signal OSC1 to output the second oscillation signal OSC2 having a phase and frequency equal to those of the first oscillation signal OSC1. At this point, the oscillation period of the second oscillation signal OSC2 is limited in response to the deactivation of the voltage detection signal DET.

For example, when the voltage detection signal DET is activated, the first oscillation signal OSC1 is oscillated at a predefined frequency after a predetermined time elapses, and the second oscillation signal OSC2 is oscillated at a predefined frequency in response to the oscillation of the first oscillation signal OSC1. However, when the voltage detection signal DET is deactivated, the first oscillation signal OSC1 is deactivated after a predetermined time elapses, and the second oscillation signal OSC2 is deactivated in response to the deactivation of the voltage detection signal DET, regardless of the continuous oscillation of the first oscillation signal OSC1 for a predetermined time.

The pumping controller 342 of the pumping unit 340 generates the first pumping control signal CTRL1 in response to the second oscillation signal OSC2. The first pumping control signal CTRL1 is a signal for controlling a charge pumping operation of the charge pump 344. The first pumping control signal CTRL1 is generated by changing the phase of the second oscillation signal OSC2. The first pumping control signal CTRL1 may include plural signals each having a different phase. The number and waveform of the first pumping control signal CTRL1 may be changed according to the configuration of the charge pump 344 of the pumping unit 340.

The second driver 348 of the pumping unit 340 receives the first pumping control signal CTRL1 to output the second pumping control signal CTRL2 having a phase and period equal to those of the first pumping control signal CTRL1. At this point, the oscillation period of the second pumping control signal CTRL2 is limited in response to the deactivation of the voltage detection signal DET.

For example, when the voltage detection signal DET is activated, the first pumping control signal CTRL1 is oscillated after a predetermined time necessary for the operations of the oscillating unit 320, the first driver 346 and the pumping controller 342, and the second pumping control signal CTRL2 is oscillated in response to the oscillation of the first pumping control signal CTRL1. However, when the voltage detection signal DET is deactivated, the first pumping control signal CTRL1 is deactivated after a predetermined time necessary for the operations of the oscillating unit 320, the first driver 346 and the pumping controller 342, and the second pumping control signal CTRL2 is deactivated in response to the deactivation of the voltage detection signal DET, regardless of the continuous oscillation of the first pumping control signal CTRL1.

The charge pump 344 of the pumping unit 340 performs the charge pumping operation in response to the second pumping control signal CTRL2 to generate the internal voltage VPP. For example, the second pumping control signal CTRL2 is oscillated, the charge pump 344 performs the charge pumping operation to generate the internal voltage VPP. When the second pumping control signal CTRL2 is not oscillated, the charge pump 344 performs no charge pumping operation, so that the internal voltage is not generated.

In summary, when the internal voltage VPP is lower than the reference voltage VREF, the voltage detecting unit 300, the oscillating unit 320, the pumping controller 346, and the charge pump 344 are sequentially operated, so that the charge pumping operation is performed to increase the voltage level of the internal voltage VPP. On the other hand, when the voltage level of the internal voltage VPP is higher than the reference voltage VREF, the oscillating unit 320, the pumping controller 346, and the charge pump 344 are simultaneously operated in response to the operation of the voltage detecting unit 300, thereby terminating the charge pumping operation.

Although not shown, the operation of the pumping unit 340 does not change even when one of the first and second drivers 346 and 348 is provided.

In case where the first driver 346 is not provided, the pumping unit 340 includes the pumping controller 342, the second driver 348, and the charge pump 344. The pumping controller 342 generates the first pumping control signal CTRL1 in response to the first oscillation signal OSC1. The second driver 348 generates the second pumping control signal CTRL2 having a frequency equal to that of the first pumping control signal CTRL1 in response to the first pumping control signal CTRL1. At this point, an oscillation period of the second pumping control signal CTRL1 is limited to an activation period of the voltage detection signal DET. The charge pump 344 performs the charge pumping operation in response to the second pumping control signal CTRL2 to output the internal voltage VPP to the internal voltage (VPP) output terminal.

The second driver 348 of the pumping unit 340 includes an inverter configured to invert the first pumping control signal CTRL1, and a NOR gate configured to perform a NOR operation on an output signal of the inverter and the voltage detection signal DET to output the second pumping control signal CTRL2. The first and second pumping control signals CTRL1 and CTRL2 each include at least one code.

In an embodiment where the second driver 348 is not provided, the pumping unit 340 includes the first driver 346, the pumping controller 342, and the charge pump 344. The first driver 346 generates the second oscillation signal OSC2 having a frequency equal to that of the first oscillation signal OSC1 in response to the first oscillation signal OSC1. At this point, an oscillation period of the second oscillation signal OSC2 is limited to an activation period of the voltage detection signal DET. The pumping controller 342 generates the pumping control signal CTRL1 in response to the second oscillation signal OSC2. The charge pump 344 performs the charge pumping operation in response to the pumping control signal CTRL1 to output the internal voltage VPP to the internal voltage (VPP) output terminal.

The first driver 346 of the pumping unit 340 includes an inverter configured to invert the first oscillation control signal OSC1, and a NOR gate configured to perform a NOR operation on an output signal of the inverter and the voltage detection signal DET to output the second oscillation signal OSC2.

The pumping control signal CTRL1 includes at least one code.

Figure 4:
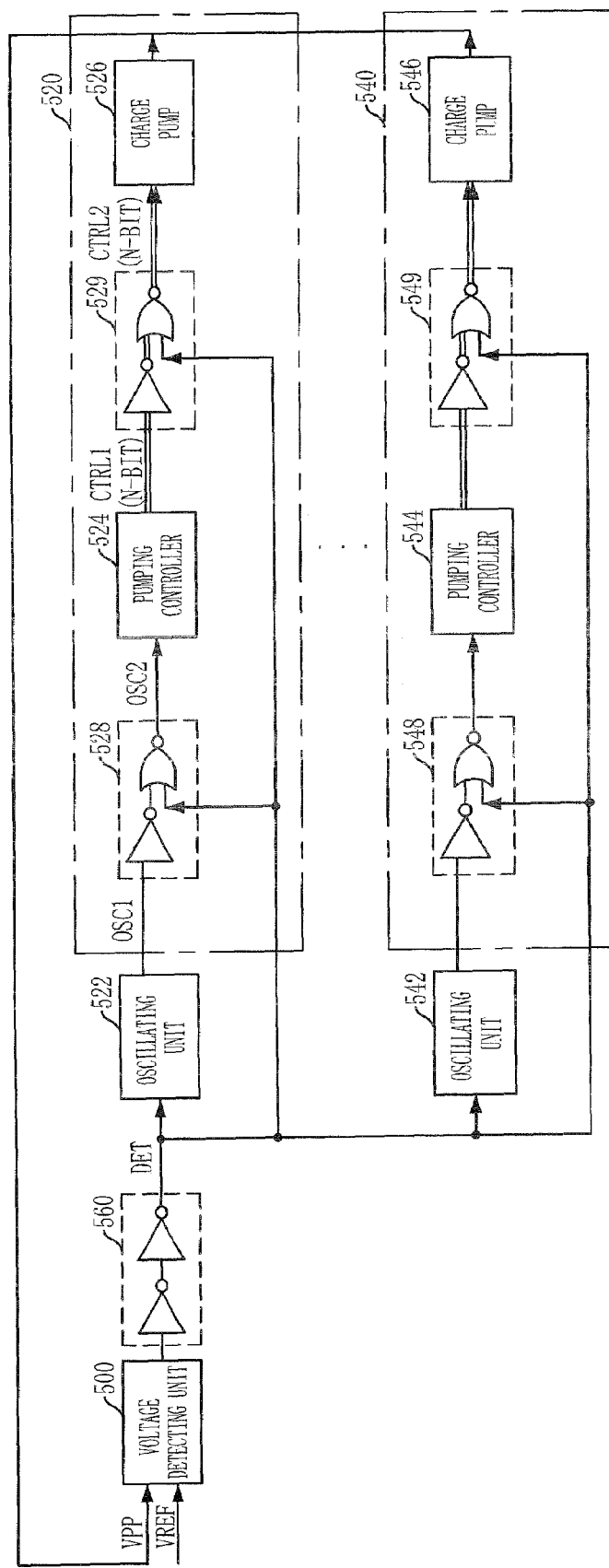
FIG. 4 is a block diagram of an internal voltage generation circuit of a semiconductor device in accordance with a second embodiment of the present invention.

FIG. 4 is a block diagram of an internal voltage generation circuit of a semiconductor device in accordance with a second embodiment of the present invention. The internal voltage generation circuit of FIG. 4 differs from the internal voltage generation circuit of FIG. 3 in that it includes a plurality of oscillating units and a plurality of pumping units.

In large-sized semiconductor devices, a plurality of internal voltage generation circuits are distributed inside the semiconductor device so as to supply the internal voltage VPP constantly. Therefore, the internal voltage generation circuit of FIG. 4 can be applied to large-sized semiconductor devices.

The internal voltage generation circuit of FIG. 4 includes a voltage detecting unit 500, and a plurality of internal voltage generating unit 520 and 540. The internal voltage generating unit 520 includes an oscillating unit 522, a pumping controller 524, a charge pump 526, a first limited oscillation period driver 528, and a second limited oscillation period driver 529. The first limited oscillation period driver 528 receives a first oscillation signal OSC1 to output a second oscillation signal OSC2 having a limited oscillation period in response to a voltage detection signal DET, and the limited oscillation period second driver 529 receives a first pumping control signal CTRL1 from the pumping controller 524 to output a second pumping control signal CTRL2 having a limited oscillation period in response to the detection signal DET. The other voltage generating units have the same configuration as the internal voltage generating unit 520.

Since the structures and operations of the oscillating units 522 and 542, the pumping controllers 524 and 544, the charge pumps 526 and 546, and the first drivers 528 and 548, and the second drivers 529 and 549 are equal to those of FIG. 3, their detailed description will be omitted.

Figure 5:
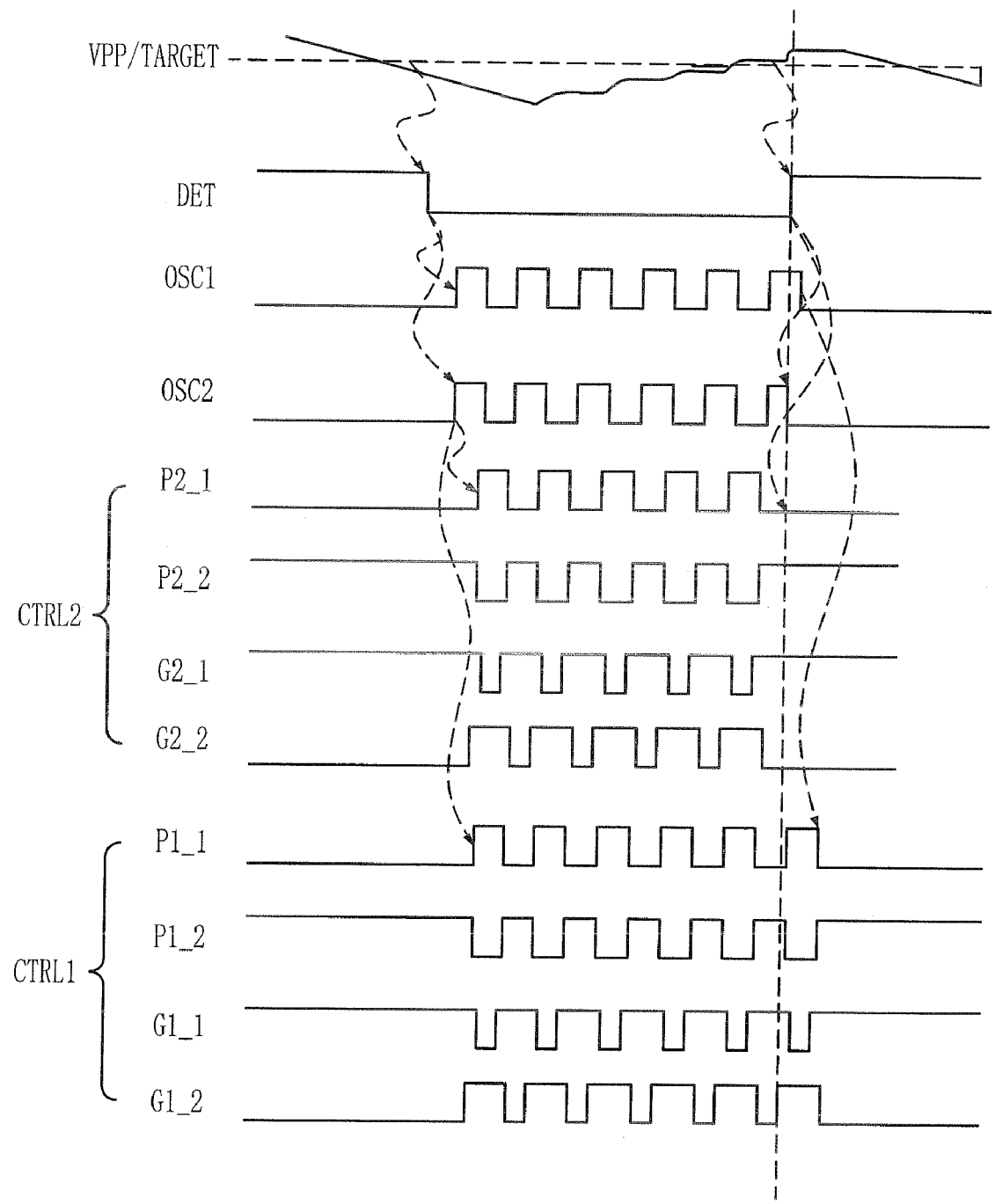
FIG. 5 is a timing diagram of signals in the internal voltage generation circuits of FIGS. 3 and 4 in accordance with an embodiment of the present invention.

FIG. 5 is a timing diagram of the various signals in the internal voltage generation circuits of FIGS. 3 and 4 in accordance with an embodiment of the present invention. Referring to FIG. 5, the internal voltage VPP repetitively rises and falls according to the voltage detection signal DET outputted from the voltage detecting unit 300, and its variation width is relatively small.

More specifically, when the voltage detection signal DET is in a deactivated initial state of a logic high level, the first and second oscillation signals OSC1 and OSC2 outputted from the oscillating unit 320 are maintained in a deactivated state of a logic low level without being oscillated. The first and second pumping control signals CTRL1 (P1_1, P2_1, G1_1, G2_1) and CTRL2 (P1_2, P2_2, G1_2, G2_2) are maintained in a deactivated state of a logic low level without being oscillated.

Since the charge pump 344 performs no charge pumping operation, the voltage level of the internal voltage VPP falls. The voltage level of the internal voltage VPP may fall due to a direct use or a natural discharge.

The voltage detection signal DET is activated when the voltage level of the internal voltage VPP becomes lower than a target level. When the voltage detection signal DET is activated to a logic low level, the first and second oscillation signals OSC1 and OSC2 are oscillated at predefined frequencies and thus the first and second pumping control signals CTRL1 (P1_1, P2_1, G1_, G2_1) and CTRL2 (P1_2, P2_2, G1_2, G2_2) are also oscillated at predefined frequencies.

Thus, the charge pump 344 performs a charge pumping operation to increase the voltage level of the increase voltage VPP. Thereafter, the voltage detection signal DET is deactivated when the voltage level of the internal voltage VPP sufficiently increases and becomes higher than the target level.

When the voltage detection signal DET is deactivated to a logic high level, the oscillation of the first oscillation signal OSC1 is terminated after a first time interval. However, the oscillation of the second oscillation signal OSC2 is not terminated at the same time when the voltage detection signal DET changes from a logic low level to a logic high level.

Likewise, the oscillation of the first pumping control signal CTRL1 (P1_1, P2_1, G1_1, G2_1) is terminated after a second time interval longer than the first time interval. However, the oscillation of the second pumping control signal CTRL2 (P1_2, P2_2, G1_2, G2_2) is terminated at the same time when the voltage detection signal DET changes from a logic low level to a logic high level.

In the internal voltage generation circuit in accordance with the embodiment of the present invention, the voltage level of the internal voltage VPP is determined in response to the second oscillation signal OSC2 and the second pumping control signal CTRL2 (P1_2, P2_2, G1_2, G2_2). Therefore, it is possible to prevent the voltage level of the internal voltage VPP from excessively increasing above the target level.

That is, the voltage level of the internal voltage VPP is not increased excessively, thereby preventing malfunction of the semiconductor device.

Further, the charge pumping operation is not performed in a period where the voltage level of the internal voltage VPP need not be increased, that is, a period after the voltage detection signal DET is deactivated, thereby saving the current consumption of the prior art semiconductor device.

Although the high voltage VPP is used as the internal voltage in the above embodiments of the present invention, any voltages generated by the charge pumping operation, e.g., a high voltage VPP and a back bias voltage VBB, can also be used as the internal voltage.

As described above, the delay of the signal for controlling the charge pumping operation of the internal voltage generation circuit can be prevented. Thus, the excessive increase in the voltage level of the internal voltage can be prevented, thereby preventing the malfunction and unnecessary current consumption of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. An internal voltage generation circuit of a semiconductor device, comprising:
   a voltage detecting unit configured to detect a voltage level of an internal voltage output terminal to output a voltage detection signal;
   an oscillating unit configured to generate a first oscillation signal having a predefined frequency in response to the voltage detection signal; and
   a pumping unit configured to perform a charge pumping operation in response to the first oscillation signal and the voltage detection signal to output an internal voltage to the internal voltage output terminal, wherein the pumping unit comprises:
   a first oscillation period driver configured to drive a second oscillation signal by receiving the first oscillation signal and the voltage detection signal;

a pumping controller configured to generate a first pumping control signal in response to the second oscillation signal;

a second oscillation period driver configured to drive a second pumping control signal by receiving the first pumping control signal and the voltage detection signal; and a charge pump configured to perform a charge pumping operation in response to the second pumping control signal to output the internal voltage to the internal voltage output terminal.

2. The internal voltage generation circuit as recited in claim 1, wherein the first and second pumping control signals include one or more signals.

3. The internal voltage generation circuit as recited in claim 1, wherein the first limited oscillation period driver comprises:

an inverter configured to invert the first oscillation signal; and a logic gate configured to perform a NOR operation on an output signal of the inverter and the voltage detection signal to output the second oscillation signal.

4. The internal voltage generation circuit as recited in claim 1, wherein the second limited oscillation period driver comprises:

an inverter configured to invert the first pumping control signal; and a logic gate configured to perform a NOR operation on an output signal of the inverter and the voltage detection signal to output the second pumping control signal.

5. A method for generating an internal voltage in a semiconductor device, the method comprising:

detecting a voltage level of an internal voltage to output a voltage detection signal; generating a first oscillation signal in response to the voltage detection signal;

performing a charge pumping operation to output an internal voltage to an internal voltage output terminal, a period of the charge pumping operation being limited within an activation period of the voltage detection signal, wherein the limiting of the period of the charge pumping operation comprises:

driving a second oscillation signal by receiving the first oscillation signal and the voltage detection signal;

generating a first pumping control signal in response to the second oscillation signal;

driving a second pumping control signal by receiving the first pumping control signal and the voltage detection signal, an oscillation period of the second pumping control signal being limited to an activation period of the voltage detection signal; and performing a charge pumping operation in response to the second pumping control signal to output the internal voltage to the internal voltage output terminal.

* * * * *